(12) United States Patent
Cheng et al.

(10) Patent No.: US 8,258,531 B2
(45) Date of Patent: Sep. 4, 2012

(54) SEMICONDUCTOR DEVICES

(75) Inventors: Chih Ching Cheng, Taichung County (TW); Ching Wen Tung, Taichung County (TW)

(73) Assignee: Huga Optotech Inc., Taichung County (TW)

( * ) Notice: Subject to any disclaimer, the term of this patent is extended or adjusted under 35 U.S.C. 154(b) by 240 days.

(21) Appl. No.: 12/732,537

(22) Filed: Mar. 26, 2010

(65) Prior Publication Data

US 2011/0233582 A1 Sep. 29, 2011

(51) Int. Cl.
*H01L 33/00* (2010.01)
(52) U.S. Cl. .................................. 257/98; 257/E33.068
(58) Field of Classification Search .................. None
See application file for complete search history.

(56) References Cited

U.S. PATENT DOCUMENTS

2006/0258027 A1* 11/2006 Ohmae et al. .................. 438/22

FOREIGN PATENT DOCUMENTS

| JP | 2003-318441 | 11/2003 |
|---|---|---|
| JP | 2005-101566 | 4/2005 |
| JP | 2008-177528 | 7/2008 |
| KR | 10-2006-0118349 | 11/2006 |
| TW | 561632 | 11/2003 |
| TW | 1236773 | 7/2005 |
| TW | 1253771 | 4/2006 |

OTHER PUBLICATIONS

"Enhanced Output Power of Near-Ultraviolet InGaN—GaN LEDs Grown on Patterned Sapphire Substrates," IEEE Photonics Technology Letters, Vol. 17, No. 2, Feb. 2005.
Office Action of Corresponding JP application No. 2010-150905 5 filed May 15, 2012 cites JP 2008-177528, JP 2005-101566, and JP 2003-318441 35.
English translation of Office action of Corresponding JP application No. 2010-150905 5 filed May 15, 2012.
English abstracts of JP 2008-177528, JP 2005-101566, and JP 2003-318441 35, cited in Corresponding JP application No. 2010-150905 5 filed May 15, 2012.
Office Action of Corresponding application No. KR 10-2010-0078702, filed on Apr. 26, 2012 cites KR 10-2006-0118349 and JP 2005-101566.
English translation of Office Action of Corresponding application No. KR 10-2010-0078702, filed on Apr. 26.
English abstract of KR 10-2006-0118349, cited in Corresponding application No. KR 10-2010-0078702.

* cited by examiner

*Primary Examiner* — Ha Tran T Nguyen
*Assistant Examiner* — Kevin Quinto
(74) *Attorney, Agent, or Firm* — WPAT, P.C.; Anthony King

(57) ABSTRACT

A semiconductor device includes a substrate and an epitaxy layer positioned on the substrate. In one embodiment of the present disclosure, the substrate includes an upper surface and a plurality of bumps positioned on the upper surface, and each of the bumps includes a top plane substantially parallel to the upper surface and a plurality of wall surfaces between the top plane and the upper surface. In one embodiment of the present disclosure, the epitaxy layer has the same crystal orientation on the upper surface of the substrate and the wall surfaces of the bumps to reduce defect density and increase protection from electrostatic discharge.

26 Claims, 6 Drawing Sheets

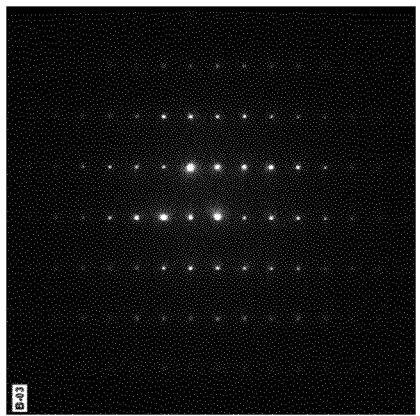
FIG. 9
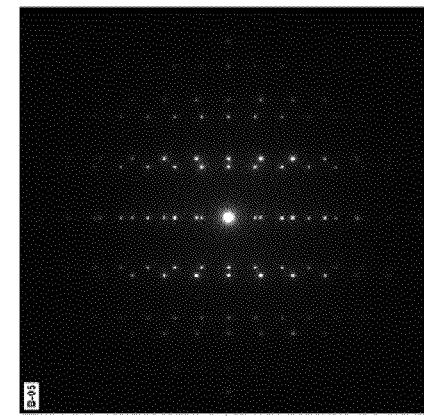
FIG. 10
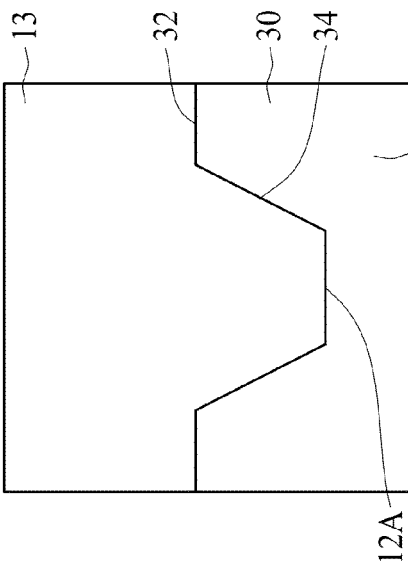
FIG. 6
FIG. 5
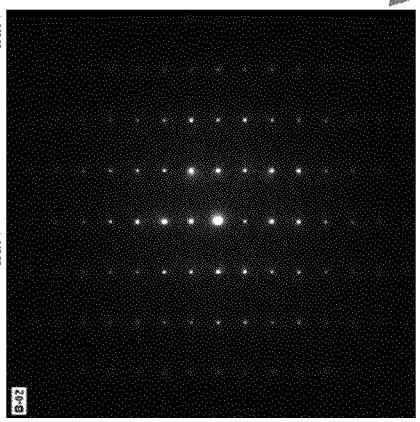
FIG. 8
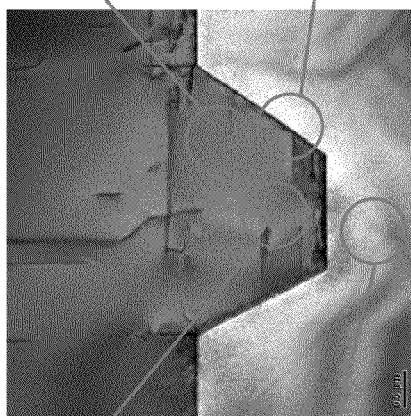
FIG. 7

SEMICONDUCTOR DEVICES

BACKGROUND OF THE INVENTION (A) Field of the Invention

The present disclosure relates to a semiconductor device, and more particularly, to a semiconductor device with an epitaxy layer having a substantially single crystal orientation on a patterned substrate to reduce defect density and increase protection from electrostatic discharge (ESD).

(B) Description of the Related Art

Semiconductor devices such as light-emitting diodes (LED) have been widely used in traffic lights, vehicle electronics, LCD backing lights, and general illumination. In the light-emitting diode an n-type semiconductor layer, a light-emitting region and a p-type semiconductor layer are essentially made to grow on a substrate to form a layered structure, and the electrodes are formed on the p-type semiconductor layer and on the n-type semiconductor layer. Light is generated through the recombination of holes and electrons that have been injected through the semiconductor layers to the light-emitting region, and the light is then emitted through a light transmitting electrode on the p-type semiconductor layer or from the substrate. The material used for preparing the visible light-emitting diode includes the III-V compound such as AlGaInP for green, yellow, orange or red light-emitting diodes, and GaN for blue or ultraviolet light-emitting diodes, wherein the GaN light-emitting diode is formed on the sapphire substrate. However, in the conventional light emitting diode there is a relatively high degree of lattice mismatch between the sapphire substrate and the gallium nitride layer formed on the sapphire substrate, and it is difficult to make a breakthrough in reducing dislocation density of the active layer.

Taiwanese Patent Publication No. 561632 discloses a light-emitting device with high external quantum efficiency. To stably secure high external quantum efficiency in the light emitting device, at least one recess and/or protruding portion is created for scattering or diffracting light generated in a light emitting region on the surface portion of a substrate. The recess and/or protruding portion has a shape that prevents crystal defects from occurring in semiconductor layers.

Taiwanese Patent Publication No. I236773 discloses a light emitting device including a substrate having a patterned surface and formed with a plurality of spaced apart cavities, and an epitaxial layer formed on the patterned surface of the substrate, having a patterned surface that is in contact with the patterned surface of the substrate, and formed with a plurality of protrusions that protrude from the patterned surface of the epitaxial layer and that are respectively received in the cavities. Each of the protrusions is polygonal in shape and defines a plurality of vertices. The vertices of each of the protrusions contact the cavity-defining wall of the respective one of the cavities so as to form a plurality of closed pores between each of the protrusions and the cavity-defining wall of the respective one of the cavities.

Taiwanese Patent Publication No. I253771 discloses a light emitting diode structure comprising a substrate with a surface and a plurality of cylindrical optical crystals, a first type doping semiconductor layer, a first electrode, a light emitting layer, a second type doping semiconductor layer and a second electrode. The first type doping semiconductor layer is formed on the substrate to cover the plurality of optical crystals. The light emitting layer, the second type doping semiconductor layer and the second electrode are formed on a portion of the first type doping semiconductor layer in sequence. The first electrode is formed on the other portion of the first type doping semiconductor layer without being covered by the light emitting layer. The substrate with optical crystals can improve the epitaxial quality of the first type doping semiconductor layer and increase the energy of the light orthogonally emitting out of the light emitting diode structure, so as to sufficiently enhance the light emitting efficiency of the light emitting diode structure.

Wuu et al. discloses a near-ultraviolet nitride-based light-emitting diode (LED) with peak emission wavelengths around 410 nm ("Enhanced Output Power of Near-Ultraviolet InGaN—GaN LEDs Grown on Patterned Sapphire Substrates," IEEE PHOTONICS TECHNOLOGY LETTERS, VOL. 17, NO. 2, FEBRUARY 2005. It was found that the electroluminescence intensity of the Patterned Sapphire Substrates (PSS) LED was 63% larger than that of the conventional LED. For a typical lamp-form PSS LED operating at a forward current of 20 mA, the output power and external quantum efficiency were estimated to be 10.4 mW and 14.1%, respectively. The improvement in the light intensity could be attributed to the decrease of threading dislocations and the increase of light extraction efficiency in the horizontal direction using a PSS.

SUMMARY OF THE INVENTION

One aspect of the present disclosure provides a semiconductor device such as electronic devices or light-emitting devices with an epitaxy layer substantially having a single crystal orientation on a patterned substrate to reduce defect density and increase protection from electrostatic discharge.

A semiconductor device according to this aspect of the present disclosure comprises a substrate and an epitaxy layer positioned on the substrate. In one embodiment of the present disclosure, the substrate includes an upper surface and a plurality of bumps positioned on the upper surface, and each of the bumps includes a top plane substantially parallel to the upper surface and a plurality of wall surfaces between the top plane and the upper surface. In one embodiment of the present disclosure, the epitaxy layer has the same crystal orientation on the upper surface of the substrate and the wall surfaces of the bumps to reduce defect density and increase protection from electrostatic discharge.

Another aspect of the present disclosure provides a semiconductor device comprising a substrate and an epitaxy layer positioned on the substrate. In one embodiment of the present disclosure, the substrate includes an upper surface and a plurality of bumps positioned on the upper surface, and each of the bumps includes a top plane substantially parallel to the upper surface and a plurality of wall surfaces between the top plane and the upper surface. In one embodiment of the present disclosure, the epitaxy layer has a substantially single crystal orientation and covers the upper surface of the substrate and the wall surfaces of the bumps substantially without voids to reduce defect density and increase protection from electrostatic discharge.

The foregoing has outlined rather broadly the features and technical advantages of the present disclosure in order that the detailed description of the invention that follows may be better understood. Additional features and advantages of the invention will be described hereinafter, and form the subject of the claims of the invention. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the invention as set forth in the appended claims.

BRIEF DESCRIPTION OF THE DRAWINGS

The objectives and advantages of the present disclosure will become apparent upon reading the following description and upon reference to the accompanying drawings in which:

FIG. 5 is a transmission electron microscope image of the semiconductor device according to one embodiment of the present disclosure;

FIG. 6 is schematic diagram showing the observation area of FIG. 5;

FIGS. 7 to 10 are nano beam diffraction images at different regions of the semiconductor device according to one embodiment of the present disclosure;

DETAILED DESCRIPTION OF THE INVENTION

Figure 1:
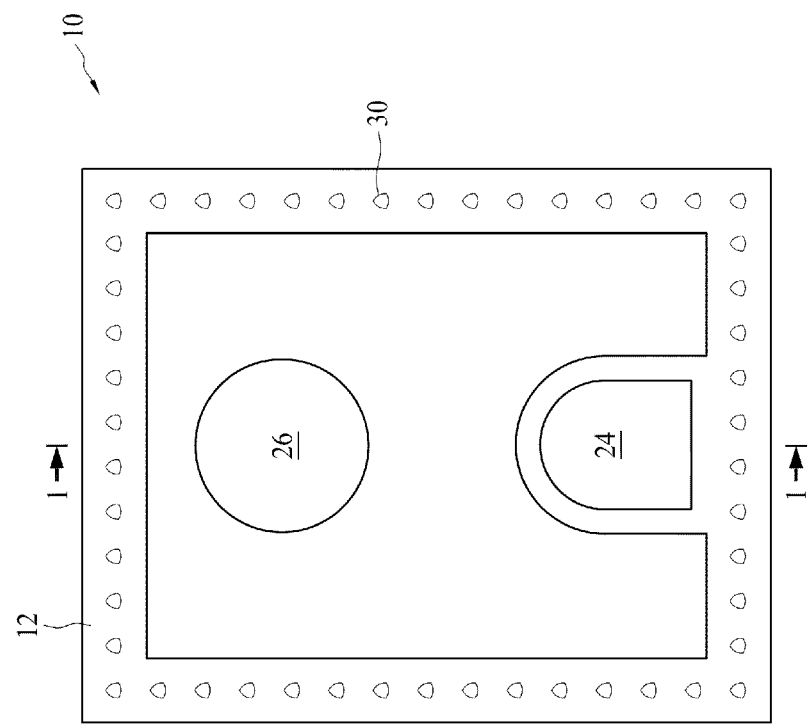
FIG. 1 is a top view of a semiconductor device according to a first embodiment of the present disclosure.
Figure 2:
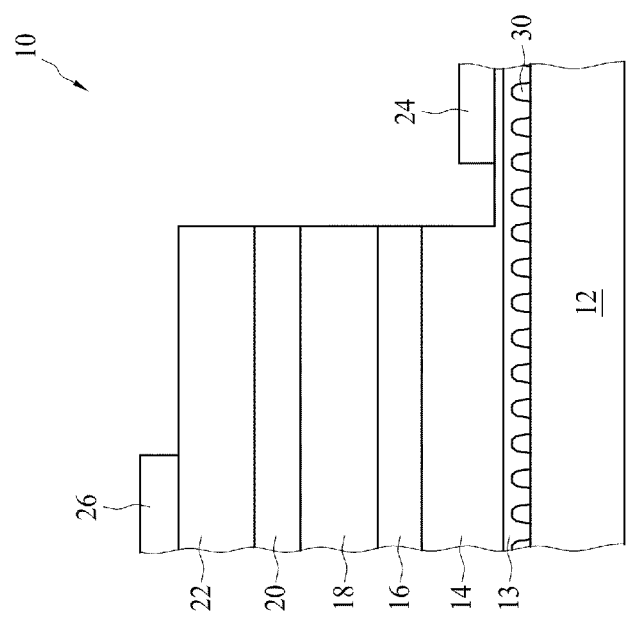
FIG. 2 is a cross-sectional view along the line 1-1 in FIG. 1.

FIG. 1 is a top view of a semiconductor device 10 according to a first embodiment of the present disclosure, and FIG. 2 is a cross-sectional view along the line 1-1 in FIG. 1. In one embodiment of the present disclosure, the semiconductor device 10 comprises a substrate 12 having a plurality of bumps 30, a buffer layer 13 positioned on the substrate 12, an n-type semiconductor layer 14 positioned on the buffer layer 13, a light-emitting structure 16 positioned on the n-type semiconductor layer 14, a p-type semiconductor layer 18 positioned on the light-emitting structure 16, a contact layer 20 positioned on the p-type semiconductor layer 18, a transparent conductive layer 22 positioned on the contact layer 20, a first electrode 24 positioned on the n-type semiconductor layer 14, and a second electrode 26 positioned on the transparent conductive layer 22.

Figure 3:
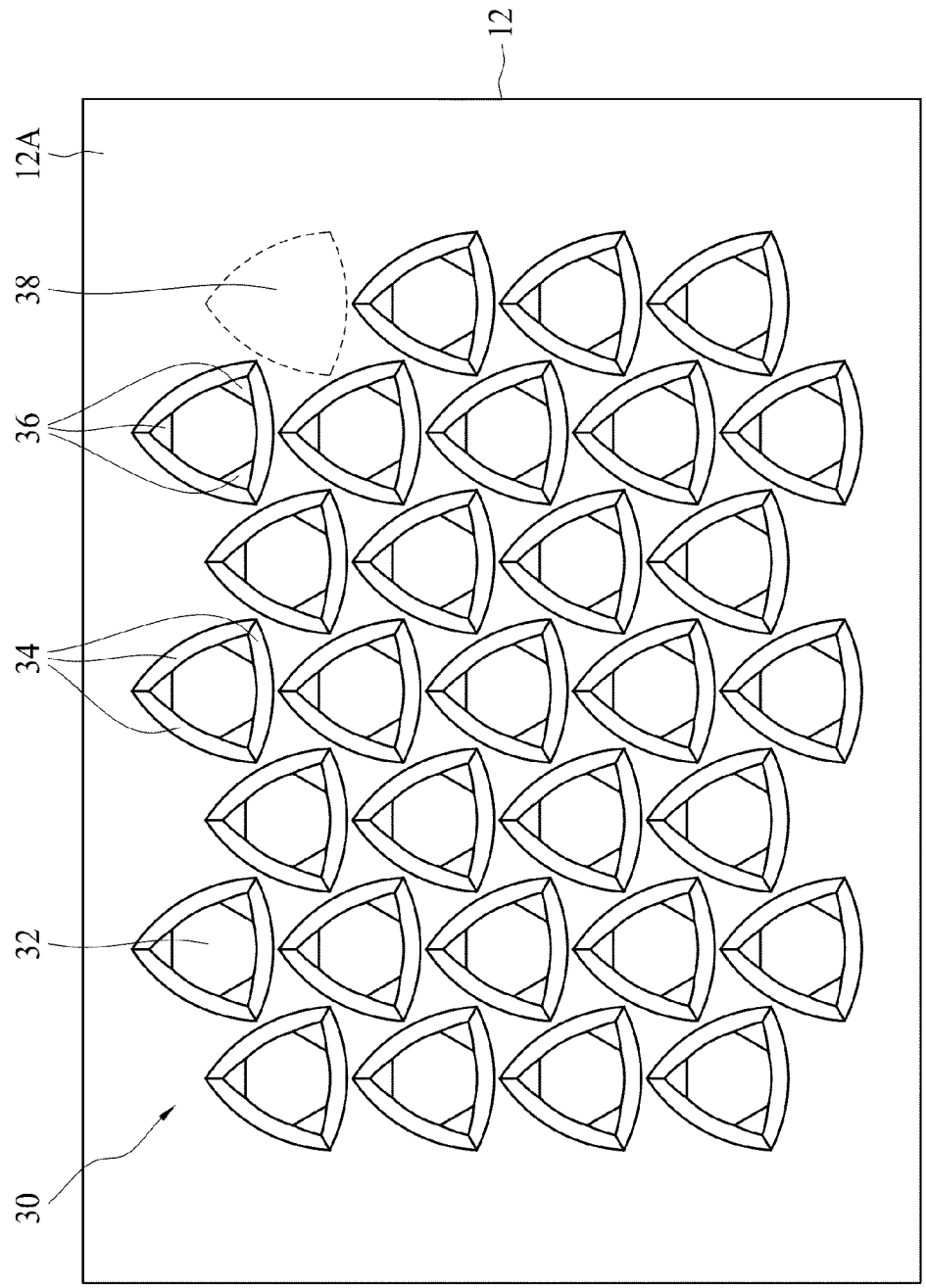
FIG. 3 is a top view of the substrate according to the first embodiment of the present disclosure.
Figure 4:
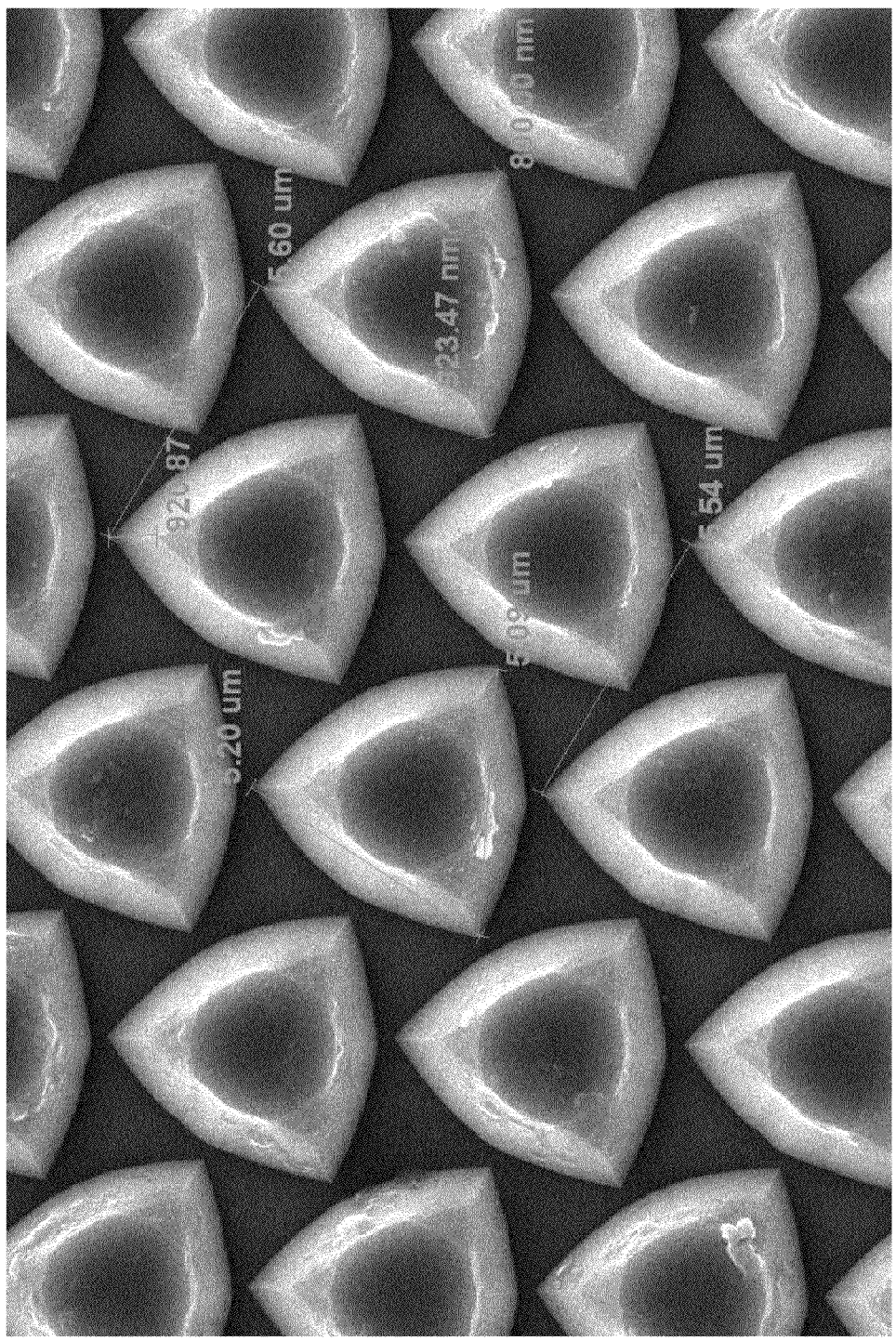
FIG. 4 is a scanning electron microscopy image of the substrate according to the first embodiment of the present disclosure.

FIG. 3 is a top view of the substrate 12 according to the first embodiment of the present disclosure, and FIG. 4 is a scanning electron microscopy image of the substrate 12 according to the first embodiment of the present disclosure. In one embodiment of the present disclosure, the substrate 12 has an upper surface 12A with the bumps 30 positioned on the upper surface 12A in a periodic manner. In one embodiment of the present disclosure, the bumps 30 are positioned in a plurality of odd rows and a plurality of even rows, and each of the bumps 30 in the even rows is positioned at an interval between an adjacent pair of bumps 30 in the odd rows. In one embodiment of the present disclosure, the height of the bumps 30 is between 0.5 and 5 microns, the interval between the adjacent two bumps 30 is between 0.5 and 10 microns, and the width of the bumps 30 is between 0.5 and 5 microns.

In one embodiment of the present disclosure, each bump 30 has a top plane 32, three wall surfaces 34, and three inclined surfaces 36 sandwiched between the top plane 32 and the wall surfaces 34, wherein each of the inclined surfaces 36 is between two of the wall surfaces 36. The wall surfaces 34 and the inclined surfaces 36 of the bump 30 have different inclined angles, which is the included angle between the upper surface 12A and the wall surface 34 (or the inclined surface 36). The wall surface 34 and the inclined surface 36 are connected, and the included angle between the inclined surface 36 and the wall surface 34 is between 90 and 180 degrees. In addition, the bump 30 has a base surface 38 having three corners, and the connection of the corners is arc-shaped, i.e., the wall surface 34 is arc-shaped.

FIG. 5 is a transmission electron microscope (TEM) image, FIG. 6 is a schematic diagram showing the observation area of FIG. 5, and FIGS. 7 to 10 are nano beam diffraction (NBD) images at different regions of the semiconductor device 10 according to one embodiment of the present disclosure. In one embodiment of the present disclosure, the substrate is a sapphire substrate, the n-type epitaxy layer 14 is a ganium nitride (GaN) layer, and a thermal treating process is performed at a predetermined temperature before growing the buffer layer 13 by the epitaxy process such that the wall surfaces 34 are substantially not suitable for crystal growing. In one embodiment of the present disclosure, the thermal treating process is performed preferably between 1030° C. and 1050° C. for 3 minutes at about 200 torrs to optionally remove the dangling bonds on the upper surface 12A and the top plane 32 so as to form surfaces suitable for crystal growing, while the wall surfaces 34 of the bumps 30 are still occupied by the dangling bonds and not suitable for crystal growing. it should be understood that various changes in the temperature, pressure and period of the thermal treating process or adding species for changing the surface condition can be made thereto without departing from the spirit and scope of the invention as defined by the appended claims.

Consequently, the epitaxy layer 13 grows from the upper surface 12A of the substrate 12 and the top plane 32, and then extends to the wall surfaces 34 of the bumps 30, such that the epitaxy layer 13 has substantially the same crystal orientation on the upper surface 12A of the substrate 12 and the wall surfaces 34 of the bumps 30 as shown in FIGS. 8 and 9. In one embodiment of the present disclosure, the epitaxy layer 13 substantially covers the upper surface 12A of the substrate 12 and the wall surfaces 34 of the bumps 30 substantially without voids embedded inside the epitaxy layer 13. In particular, the diffraction image of the epitaxy layer 13 on the wall surfaces 34 of the bumps 30 coincides with the diffraction image of the substrate 12, as shown in FIG. 10. As a result, the defect density in the epitaxy layer 13 and the layers thereon can be reduced, and the semiconductor device 10 has increased protection from electrostatic discharge due to the decreased defect density.

Figure 14:
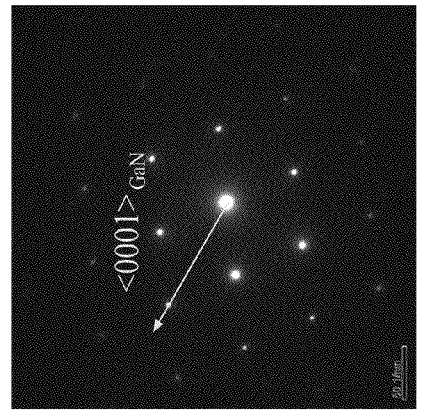
FIGS. 12 to 15 are nano beam diffraction images of the semiconductor device according to one comparison embodiment of the present disclosure.
Figure 15:
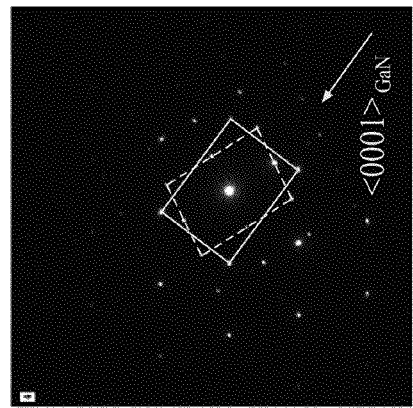
Figure 11:
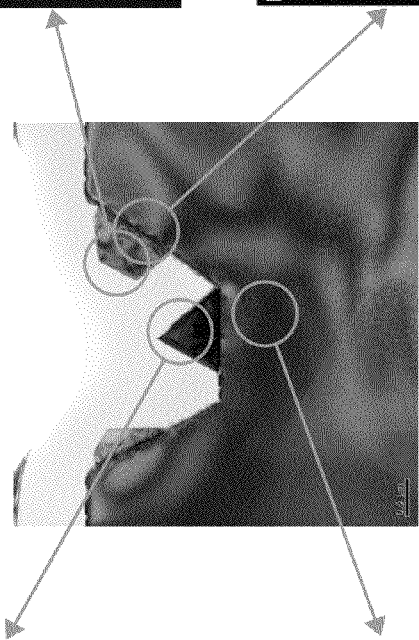
FIG. 11 is a transmission electron microscope image of the semiconductor device according to one comparison embodiment of the present disclosure.
Figure 13:
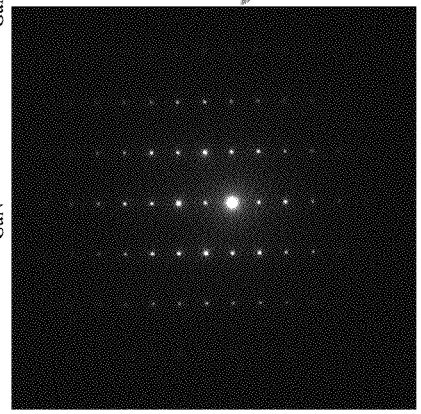
Figure 12:
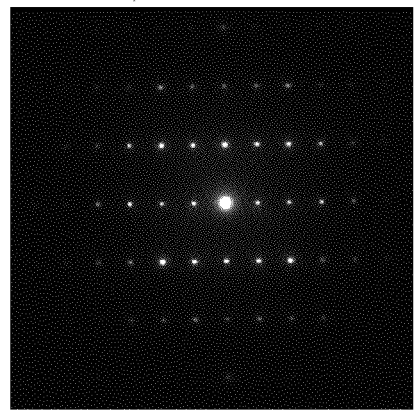

FIG. 11 is a transmission electron microscope image and FIGS. 12 to 15 are nano beam diffraction images of the semiconductor device formed by the thermal treating process at a temperature above 1050° C. before growing the buffer layer 13 according to one comparison embodiment of the present disclosure. The thermal treating process removes the dangling bonds on the upper surface 12A of the substrate 12 and the wall surfaces 34 and the top plane 32 of the bumps 30 so that these surfaces are suitable for crystal growing, and the epitaxy layer 13 can grow either from the upper surface 12A of the substrate 12 or from the wall surfaces 34 of the bumps 30. Consequently, the epitaxy layer 13 has different crystal orientations on the upper surface 12A of the substrate 12 and the wall surfaces 34 of the bumps 30 as shown in FIGS. 13 and 14, and the prepared epitaxy layers on the substrate 12 inherently possess defects at the interface between the wall surfaces and the upper surface. In particular, the diffraction image of the epitaxy layer on the wall surfaces of the bumps does not coincide with the diffraction image of the substrate, as shown in FIG. 15. As a result, the defect density increases in the layers on the buffer layer and the semiconductor device has poor electrostatic discharge protection ability due to the increased defect density.

In one embodiment of the present disclosure, the substrate 12 includes transparent insulation material such as sapphire, silicon, or silicon carbide; the buffer layer 13, the n-type semiconductor layer 14, the light-emitting structure 16 and the p-type semiconductor layer 18 may include III-V material selected from the group consisting of AlGaN, GaN, InGaN, AlGaInN, GaP, or GaAsP; the contact layer 20 includes III-V material such as AlGaN, GaN, InGaN, AlGaInN, GaP, or GaAsP; the transparent conductive layer 22 includes indium oxide, tin oxide or indium tin oxide; and the light-emitting structure 16 may include the quantum well or multi-quantum well structure sandwiched between a p-cladding layer and an n-cladding layer on the n-type semiconductor layer 114. In addition, the n-type semiconductor layer 14, the light-emitting structure 16 and the p-type semiconductor layer 18 may include II-VI material selected from the group consisting of ZnCdSe, ZnMgSe, ZnBaSe, ZnBeSe, ZnCaSe, ZnSrSe, ZnCdSSe, ZnMgSSe, ZnCdTe, ZnMgTe, ZnBaTe, ZnBeTe, ZnCaTe, ZnSrTe, ZnCdSTe and ZnMgSTe. In particular, the epitaxy machine can be used to prepare these layers on the substrate 12.

In one embodiment of the present disclosure, the top plane 32 is a C-plane (0,0,1) substantially parallel to the upper surface 12A of the substrate 12. The preparation of the bumps 30 may include the steps of forming a mask having a plurality of patterns covering a portion of the substrate, and performing an etching process to remove a portion of the substrate not covered by the mask to form the bumps 30 under the patterns. In one embodiment of the present disclosure, the etching process is a wet etching process using an etchant including phosphoric acid.

Although the present disclosure and its advantages have been described in detail, it should be understood that various changes, substitutions and alterations can be made thereto without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
   a substrate including an upper surface and a plurality of bumps positioned on the upper surface, each of the bumps including a top plane substantially parallel to the upper surface and a plurality of wall surfaces between the top plane and the upper surface; and
   an epitaxy layer positioned on the substrate, wherein the epitaxy layer has substantially the same crystal orientation on the upper surface of the substrate and the wall surfaces of the bumps;
   wherein each of the bumps includes a plurality of inclined surfaces sandwiched between the top plane and the wall surfaces, each of the inclined surfaces is between two of the wall surfaces, and the epitaxy layer has the same crystal orientation on the wall surfaces and the inclined surfaces of the bumps.

2. The semiconductor device of claim 1, wherein the inclined surface and the wall surface have different inclined angles.

3. The semiconductor device of claim 1, wherein the inclined surface connects to the wall surface, and the included angle between the inclined surface and the wall surface is between 90 and 180 degrees.

4. The semiconductor device of claim 1, wherein the wall surface is arc-shaped.

5. The semiconductor device of claim 1, wherein the diffraction image of the epitaxy layer on the wall surfaces of the bumps coincides with the diffraction image of the substrate.

6. The semiconductor device of claim 1, wherein the top plane is a C-plane.

7. The semiconductor device of claim 1, wherein the bumps are positioned on the upper surface in a periodic manner.

8. The semiconductor device of claim 1, wherein the bumps are positioned into a plurality of odd rows and a plurality of even rows, and each of the bumps in the even rows is positioned at an interval between an adjacent pair of bumps in the odd rows.

9. The semiconductor device of claim 1, wherein the height of the bumps is between 0.5 and 5 microns.

10. The semiconductor device of claim 1, wherein the interval between the adjacent two bumps is between 0.5 and 10 microns.

11. The semiconductor device of claim 1, wherein the width of the bumps is between 0.5 and 5 microns.

12. The semiconductor device of claim 1, further comprising a light-emitting structure positioned on the epitaxy layer.

13. The semiconductor device of claim 12, wherein the bumps are configured to scatter and/or diffract light from the light-emitting structure.

14. A semiconductor device, comprising:
   a substrate including an upper surface and a plurality of bumps positioned on the upper surface, each of the bumps including a top plane substantially parallel to the upper surface and a plurality of wall surfaces between the top plane and the upper surface; and
   an epitaxy layer positioned on the substrate, wherein the epitaxy layer has a substantially single crystal orientation and covers the upper surface of the substrate and the wall surfaces of the bumps substantially without voids;
   wherein each of the bumps includes a plurality of inclined surfaces sandwiched between the top plane and the wall surfaces, each of the inclined surfaces is between two of the wall surfaces, and the epitaxy layer has the same crystal orientation on the wall surfaces and the inclined surfaces of the bumps.

15. The semiconductor device of claim 14, wherein the inclined surface and the wall surface have different inclined angles.

16. The semiconductor device of claim 14, wherein the inclined surface connects to the wall surface, and the included angle between the inclined surface and the wall surface is between 90 and 180 degrees.

17. The semiconductor device of claim 14, wherein the wall surface is arc-shaped.

18. The semiconductor device of claim 14, wherein the diffraction image of the epitaxy layer on the wall surfaces of the bumps coincides with the diffraction image of the substrate.

19. The semiconductor device of claim 14, wherein the top plane is a C-plane.

20. The semiconductor device of claim 14, wherein the bumps are positioned on the upper surface in a periodic manner.

21. The semiconductor device of claim 14, wherein the bumps are positioned into a plurality of odd rows and a plurality of even rows, and each of the bumps in the even rows is positioned at an interval between an adjacent pair of bumps in the odd rows.

22. The semiconductor device of claim 14, wherein the height of the bumps is between 0.5 and 5 microns.

23. The semiconductor device of claim 14, wherein the interval between the adjacent two bumps is between 0.5 and 10 microns.

24. The semiconductor device of claim 14, wherein the width of the bumps is between 0.5 and 5 microns.

25. The semiconductor device of claim 14, further comprising a light-emitting structure positioned on the epitaxy layer.

26. The semiconductor device of claim 25, wherein the bumps are configured to scatter and/or diffract light from the light-emitting structure.

* * * * *